United States Patent [19]
Erickson

[11] Patent Number: 5,815,016
[45] Date of Patent: Sep. 29, 1998

[54] PHASE-LOCKED DELAY LOOP FOR CLOCK CORRECTION

[75] Inventor: Charles R. Erickson, Fremont, Calif.

[73] Assignee: Xilinx, Inc., San Jose, Calif.

[21] Appl. No.: 665,169

[22] Filed: Jun. 14, 1996

Related U.S. Application Data

[63] Continuation-in-part of Ser. No. 632,523, Apr. 12, 1996, Pat. No. 5,646,564, which is a continuation of Ser. No. 300,608, Sep. 2, 1994, abandoned.

[51] Int. Cl.$^6$ .............................. H03L 7/00; H03K 5/00
[52] U.S. Cl. ............................. 327/158; 327/244; 327/5; 327/276
[58] Field of Search .................................. 327/3, 5, 8, 12, 327/172, 176, 149, 153, 151, 158, 160, 161, 243, 244, 236, 147, 155, 146, 277

[56] References Cited

U.S. PATENT DOCUMENTS

| | | | |
|---|---|---|---|
| 4,051,440 | 9/1977 | Nelson et al. | 328/134 |
| 4,222,013 | 9/1980 | Bowers et al. | 331/1 A |
| 4,322,643 | 3/1982 | Preslar | 307/528 |
| 4,959,617 | 9/1990 | Martin | 327/12 |
| 5,039,893 | 8/1991 | Tomisawa | 307/597 |
| 5,052,031 | 9/1991 | Molloy | 375/120 |
| 5,068,628 | 11/1991 | Ghoshal | 331/1 A |
| 5,087,829 | 2/1992 | Isibashi et al. | 307/269 |
| 5,099,477 | 3/1992 | Taniguchi et al. | 370/97 |
| 5,109,394 | 4/1992 | Hjerpe et al. | 375/119 |
| 5,120,990 | 6/1992 | Koker | 307/269 |
| 5,144,254 | 9/1992 | Wilke | 328/14 |
| 5,155,379 | 10/1992 | Narahara | 327/176 |

(List continued on next page.)

FOREIGN PATENT DOCUMENTS 9117645  8/1992  United Kingdom .

OTHER PUBLICATIONS

A. Efendovich, Y. Afek, C. Sella, Z. Bikowsky, "Multi–Frequency Zero–Jitter Delay–Locked Loop",pp. 27.1.1–27.1.4, IEEE 1993, Custom Integrated Circuits Conference.

T. Lee, K. Donnelly, J. Ho, J. Zerbe, M. Johnson. T. Ishikawa, "A 2.5V Delay–Locked Loop for an 18 Mb 500 MB/s DRAM", IEEE International Solid–State Circuits Conference, ISSCC94/Session 18/High–Performance Logic and Circuit Techniques/Paper FA 18.6, 1994.

A. Waizman, "A Delay Line Loop for Frequency Synthesis of De–Skewed Clock", IEEE International Solid–State Circuits Conference, ISSCC94/Session 18/High–Performance Logic and Circuit Techniques/Paper FA 18.5, 1994.

Mark G. Johnson and Edwin L. Hudson, "A Variable Delay Line PLL for CPU–Coprocessor Synchronization", IEEE Journal of Solid–State Circuits, vol. 23, No. 5, Oct. 1988.

*Primary Examiner*—Terry Cunningham
*Assistant Examiner*—Eunja Shin
*Attorney, Agent, or Firm*—Edel M. Young; Patrick T. Bever, Esq.; Bever & Hoffman

[57] ABSTRACT

A controlled delay path inserts a selected delay into a clock distribution circuit to create a total clock delay that is equal to an integer number of clock cycles relative to a reference dock signal or which produces a selected phase relationship to the reference dock signal. The delay path correction of the invention is particularly useful in circuits having a wide range of possible system clock frequencies or having programmable routing of clock signals, and therefore a wide range of operating delays. A reference clock signal is directed to a range of selectable voltage controlled delay elements by a phase detector that receives the reference clock signal and a feedback signal, and that produces an error voltage which adjusts the voltage controlled delay elements to produce an output clock signal. Additional selectable delays may be included that create offset options and allow selection of a leading, lagging, or in-phase reference dock/output clock relationship. In one embodiment both the positive and negative edges of a clock signal are corrected. As another feature, if correction is consistently in the same direction an error flag is generated.

2 Claims, 8 Drawing Sheets

U.S. PATENT DOCUMENTS

| | | | |
|---|---|---|---|
| 5,173,617 | 12/1992 | Alsup et al. | 307/269 |
| 5,191,295 | 3/1993 | Necoechea | 328/155 |
| 5,204,564 | 4/1993 | Ochiai | 307/603 |
| 5,208,546 | 5/1993 | Nagaraj et al. | 328/155 |
| 5,210,509 | 5/1993 | Greeff et al. | 331/4 |
| 5,216,302 | 6/1993 | Tanizawa | 307/603 |
| 5,220,294 | 6/1993 | Ichikawa | 331/1 A |
| 5,223,755 | 6/1993 | Richley | 307/603 |
| 5,260,608 | 11/1993 | Marbot | 307/262 |
| 5,260,979 | 11/1993 | Parker et al. | 331/25 |
| 5,278,520 | 1/1994 | Parker et al. | 331/25 |
| 5,307,028 | 4/1994 | Chen | 331/1 A |
| 5,355,037 | 10/1994 | Andresen et al. | 307/602 |
| 5,389,843 | 2/1995 | McKinney | 327/276 |
| 5,428,309 | 6/1995 | Yamauchi et al. | 327/158 |
| 5,430,394 | 7/1995 | McMinn et al. | 327/292 |
| 5,463,337 | 10/1995 | Leonowich | 327/158 |

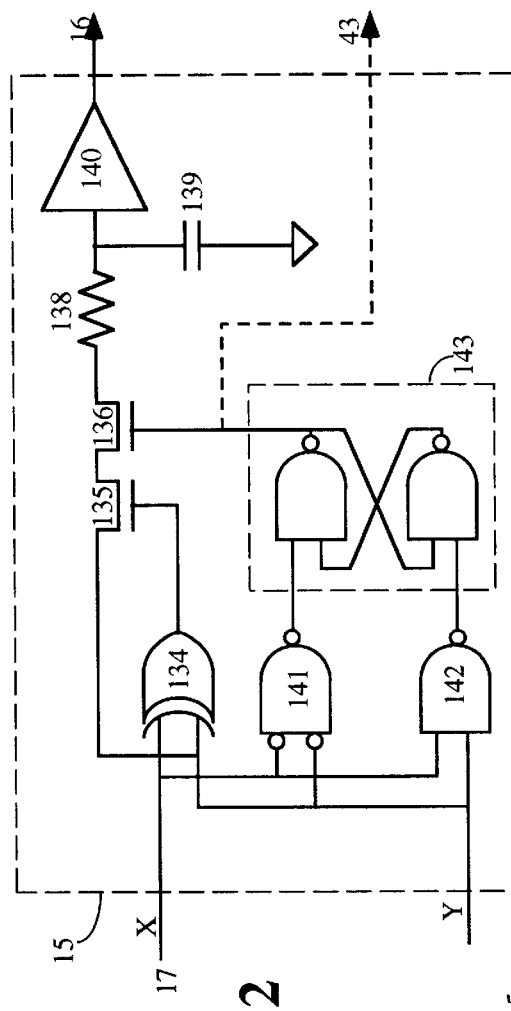
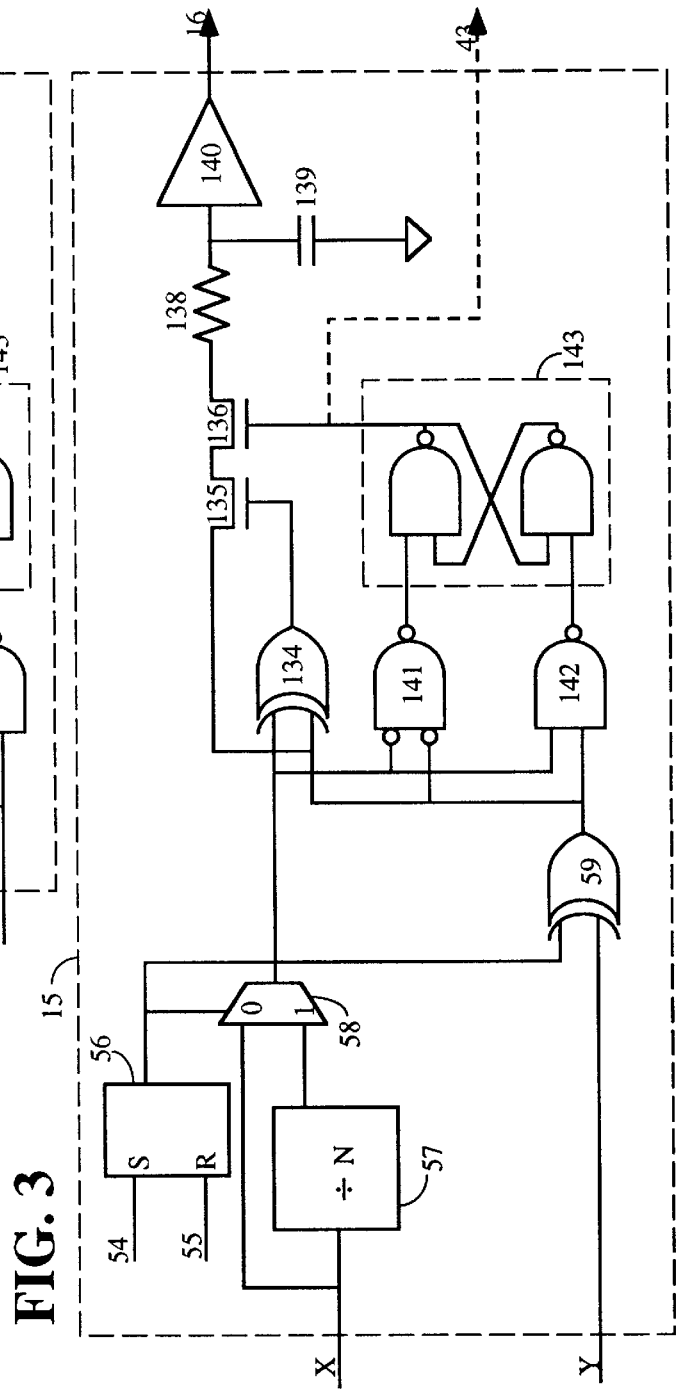
FIG. 2
FIG. 3

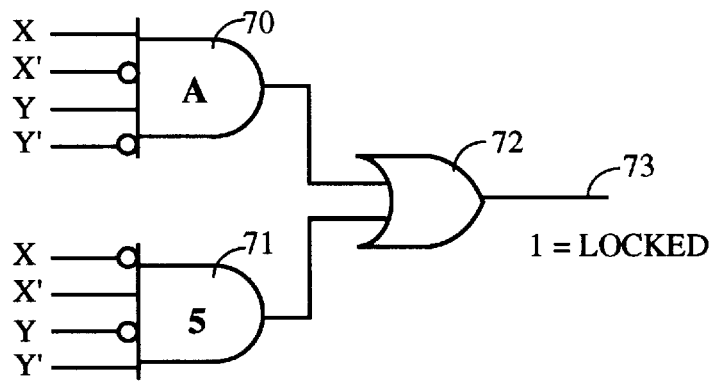
Fig. 9
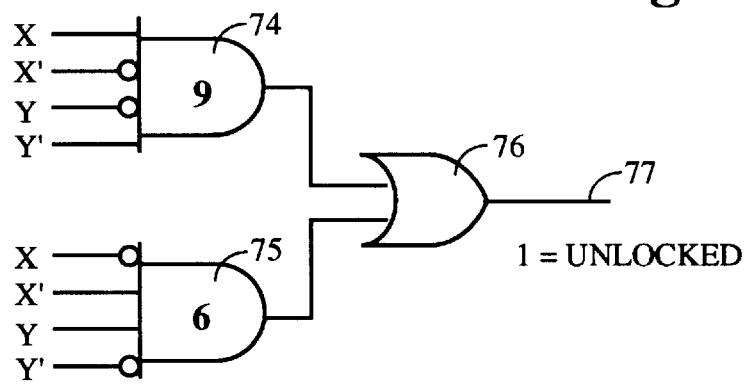
Fig. 10
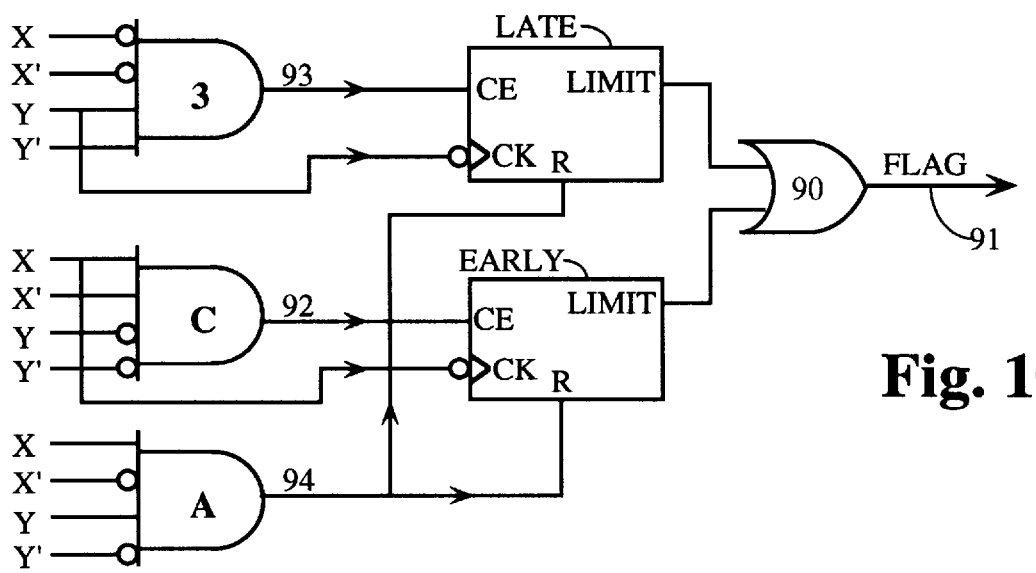

PHASE-LOCKED DELAY LOOP FOR CLOCK CORRECTION

RELATED APPLICATION

This is a continuation in part of application Ser. No. 08/632,523 filed Apr. 12, 1996, now U.S. Pat. No. 5,646,564, which is a file wrapper continuation of application Ser. No. 08/300,608 filed Sep. 2, 1994, now abandoned.

TECHNICAL FIELD

The present invention relates to clock distribution in digital circuits. More particularly, the present invention relates to a controlled delay path for phase synchronizing an output clock signal to a reference clock signal.

DESCRIPTION OF THE PRIOR ART

Modern digital electronic systems are comprised of a number of cooperating sequential logic circuits that each perform several routine operations, and that are each controlled by derivatives of a common clock signal. The derivative clock signals must be synchronized at locations within the system if the system is to function optimally. Although the derivative clock signals may have a common source, they may not arrive at their intended destinations in proper synchronism, for example due to variations in signal propagation delay for each destination. Thus, combining several complex sequential logic circuits within a system presents a challenge with respect to synchronizing the time frames of each of the circuits with each other.

Because synchronous sequential logic circuits change states only at the rising or falling edge of a synchronous clock signal, proper circuit operation requires that any external input signals to the synchronous sequential logic circuit must occur with the proper set up time and hold time requirements relative to the designated clock edge. However, in a system comprised of sequential logic circuits having a master system clock that operates the several diverse system circuits there is a problem with skew between the system clock and the destination clock signals propagated through the various circuits.

As integration levels of microelectronic circuits and system complexity continues to increase, the routing or distribution of a master system clock becomes more critical. This problem is exacerbated by ever increasing clock rates. Clock distribution must take into account distribution topography across the circuit, propagation delays in routing the clock signal to all elements on the circuit, desired set up and hold times, and variations in system design parameters, such as system clock rate, all of which affect the phase of a dock signal throughout the circuit.

One solution to this problem is to employ a voltage controlled delay element in a phase-locked loop to adjust the various signals such that the edges of the internal clock signals are aligned with the edge of a later cycle of the master or reference clock signal. The phase-locked loop provides feedback that nulls out clock distribution delays within the circuit by comparing the phase of a reference clock signal with that of a feedback signal. The difference between the two signals is used to bring the first and second signals into a fixed phase relation.

With regard to a clock distribution scheme, the reference signal is typically derived from a master system clock, and the feedback signal is typically a controlled signal of variable frequency. In such digital phase-locked loops, a digital phase detector is used, although the phase-locked loop architecture is otherwise composed of analog elements, i.e. voltage controlled oscillator, loop filter. See for example A. Wray, *Clock Synchronization Circuit for Digital Communications System*, UK Patent Application No. GB 9117645 (15 Aug. 1992) which discloses a burst-mode TDMA system including a clock synchronization circuit that provides a clock signal having a frequency that is greater than the frequency of the received data signal. An AND gate and divider logically combine the clock signal with the received data signal to provide a synchronization signal for the digital communications system. The synchronization signal is compared with the received data signal and an error signal is generated in response to the difference. Delay circuitry successively introduces delays to the clock signal to reduce the error in response to transitions of the synchronization signal until the synchronization and received data signals are synchronized.

See, also M. Alsup, C. Dobbs, E. Haddad, C. Moughanni, Y. Wu, *Digital Phase Lock Clock Generator Without Local Oscillator*, U.S. Pat. No. 5,173,617 (22 Dec. 1992) (digital phase-locked loop including a phase detector that controls, and an up-down counter to program, an increase/decrease in a tapped delay line); J. Hjerpe, D. Russell, R. Young, *All Digital Phase-Locked Loop*, U.S. Pat. No. 5,109,394 (28 Apr. 1992) (digital phase-locked loop for synchronizing an output clock with a reference clock signal, including a multiple-tap, digital delay chain to delay the output clock signal); D. Preslar, *Digital Phase Comparator With Improved Sensitivity For Small Phase Differences*, U.S. Pat. No. 4,322,643 (30 Mar. 1982) (digital phase comparator for eliminating the dead zone in the phase correction means of a phase-locked loop); A. Efendovich, Y. Afek, C. Sella, Z. Bikowsky, *Multi-Frequency Zero-Jitter Delay-Locked Loop*, IEEE 1993 Custom Integrated Circuits Conference (1993) (all digital delay-locked loop); T. Lee. K. Donnelly, J. Ho, J. Zerbe, M. Johnson, T. Ishikawa, *A 2.5V Delay-Locked Loop for an 18 Mb 500 MB/s DRAM*, IEEE International Solid-State Circuits Conference (1994) (receive delay-locked loop); and A. Waizman, *A Delay Line Loop for Frequency Synthesis of De-Skewed Clock*, IEEE International Solid-State Circuits Conference (1994) (delay line loop clock generator circuit used for frequency synthesis multiplication of a de-skewed clock).

Modern system designs may specify a wide range of system clock rates, e.g. from 10-MHz or less to 100-MHz or more. When it is considered that clock distribution may consume 20% or more of a clock period, it is clear that clock delays, while not critical at slower clock rates (for example at 10-MHz, where a clock delay of 5 nsec is about 5% of a clock period of 100 nsec), clock delays become extremely critical at faster clock rates (for example at 100-MHz, where a clock delay of 5 nsec (i.e. 50%) is unacceptable when compared to a clock period of 10 nsec). While a phase-locked loop may include a series of tapped delays, such as buffers, voltage controlled delays, shift registers, and the like, to extend its range of operation, such expedients take up considerable space while providing only a minimal extension of operating range. Thus, while a conventional phase-locked loop may be useful for a narrow range of system clock rates, it is not practical for complex integrated circuits that are intended for a wide variety of system applications over a broad range of system clock rates.

If the system provides a master clock of the correct frequency, there is no need in an integrated circuit chip within the system for a phase-locked loop having a voltage controlled oscillator because the fundamental problem in the chip is aligning the internal device clock edges precisely with the edges of the system clock such that all elements in the chip operate in synchronism. Accordingly, within the chip there is a need to synchronize (i.e. de-skew or match rising edges) output clock signals with that of a master clock in a precise and stable manner over a wide range of operating parameters and reference clock frequencies, so as to cancel uncertainty introduced by internal clock distribution delays.

SUMMARY OF THE INVENTION

The present invention provides a controlled delay path that inserts a selected delay into a clock distribution circuit to create a total delay at a selected location that is equal to an integer number of clock cycles. The invention is particularly useful for matching the phase of an output clock signal to that of a reference clock signal, for example by introducing a selected delay, such that the output clock is delayed sufficiently to compensate for propagation delays associated with distribution of the clock to its destination. Edges of feedback and reference clock signals are in-phase, even though the feedback signal may be displaced from the reference clock signal by one or more cycles. In one embodiment, an output clock signal may have a selected phase relationship to the feedback and reference clock signals. The invention is especially useful in connection with circuits having a wide range of possible system clock rates, and an unknown distribution of operating delays, for example as are found in programmable logic devices such as field programmable gate arrays.

The invention comprises a delay circuit in which a reference clock signal is provided to one or more selectable voltage controlled delay elements that produce a delay-corrected output clock signal that is used to clock the various internal sequential logic elements of each system component. A phase detector receives the reference clock signal and a feedback signal from the output of the voltage controlled delay elements, and produces a corresponding error voltage that drives a selectable number of voltage controlled delay elements. By selecting the number of delay elements, a user who programs the circuit can adjust the timing of the output clock signal based upon specific output clock signal routing and other propagation delays known to the user but not to the chip designer. Additional selectable delays may be included by the user to create offsets that permit the output clock signal to appear as leading, lagging, or in-phase relative to the reference clock signal.

An alternative embodiment of the invention inverts one of the two phase detector input signals such that the negative transition of one of the signals input to the phase detector is aligned to the positive transition of the other signal input to the phase detector, and such that the delay is adjusted to correspond to the LOW time of the non-inverted signal.

For initial phase adjustment when the output clock signal to be distributed through the chip is not in phase with the reference clock signal, a divide-by-N circuit is provided to provide a temporary reference signal lower in frequency than the reference clock signal. In this way, an initial or rough delay adjustment may be made to bring the feedback signal to within its normal adjustment range, after which the circuit may be switched to a more precise phase-locked mode of operation.

BRIEF DESCRIPTION OF THE DRAWINGS

FIGS. 2 and 3 show two schematic diagrams of phase detectors usable in the circuit of FIG. 1;

FIG. 9 is a schematic diagram of a lock/unlock indicator circuit for use in connection with the delay circuit of FIG. 6, and implementing a state detector for detecting some of the states illustrated in the Karnaugh map of FIG. 7; and FIG. 10 is a schematic representation of a range adjust limit detector circuit according to the invention.

DETAILED DESCRIPTION OF THE INVENTION

The present invention provides a programmable phase locked loop that inserts a user-selected amount of delay into a clock distribution circuit to create a distributed clock signal having a selected phase relationship to an input reference clock signal, and that thereby compensates for the uncertainty associated with propagation delay that occurs during clock distribution in digital systems. The invention is especially useful in circuits that may be operated with a wide range of system clocks, and therefore a wide range of operating delays, such as programmable logic devices, e.g. field programmable logic devices.

Figure 1:
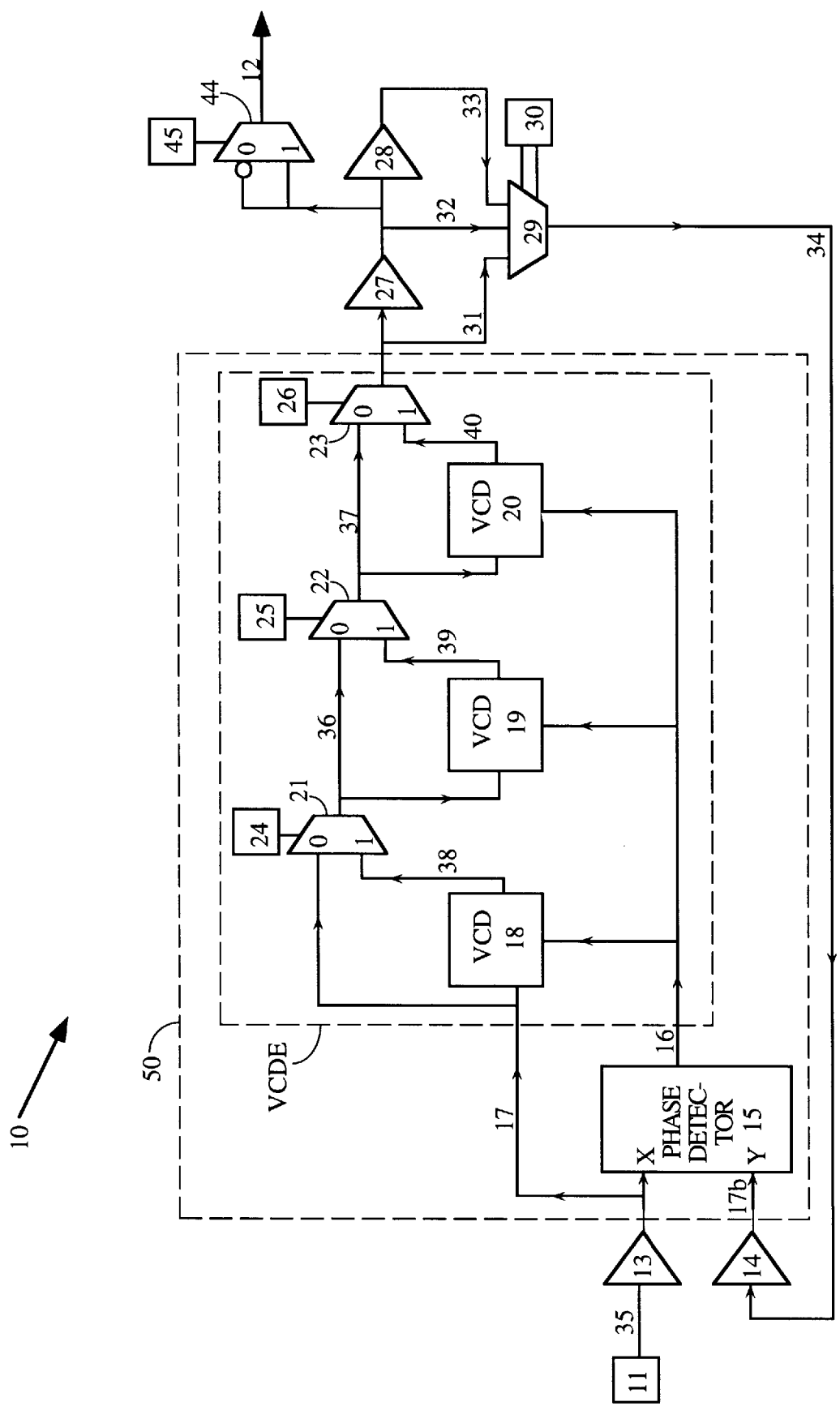
FIG. 1 is a block level schematic diagram showing a phase-locked loop that incorporates a series of selectable voltage controlled delay elements according to the present invention.

FIG. 1 is a block level schematic diagram showing a phase-locked loop 10 that incorporates a series of selectable voltage controlled delay elements 18, 19, 20. The voltage controlled delay elements produce a selectable delay in an output clock signal. Delay elements 18, 19, and 20 can be inserted into the delay path at the choice of the user. Each of voltage controlled delay elements 18, 19, and 20 has a range of delays which it can provide, bounded by a minimum delay and a maximum delay. Voltage controlled delay elements are known in the art. One voltage controlled delay element is described by Mark G. Johnson and Edwin L. Hudson in an article entitled "A Variable Delay Line PLL for CPU-Coprocessor Synchronization" published in the IEEE Journal of Solid-State Circuits, vol. 23, No. 5, October 1988. In one embodiment, the three elements have three different ranges of delay, so that a wide range of total delay can be provided. The wide range is useful for a wide range of reference clock frequencies which a user may select when operating a field programmable device.

During circuit operation, a reference clock signal is input to the phase-locked loop circuit 10 at an input terminal 11. The reference clock signal is buffered by a buffer 13 and coupled to a first input terminal X of a phase detector 15. The buffered reference clock signal is also provided to a voltage controlled delay element 18 and a multiplexer 21. The phase detector 15 receives a feedback signal 34 buffered by buffer 14 at an input terminal Y and produces an error voltage 16 that represents the phase difference between the feedback signal and the reference clock signal. The error voltage is applied to the voltage controlled delay elements 18, 19, 20.

The voltage-controlled delay elements 18, 19, 20 are connected to a series of corresponding multiplexers 21, 22, 23 that, in turn, are operated by control signals applied by a corresponding control element 24, 25, 26 to select or deselect a specific delay element or a combination of delay elements, such that the delays may be introduced singly, or they may be cascaded. Thus, the buffered reference clock signal 17 may be selectively passed through the various voltage-controlled delay elements.

The feedback signal 34 is delayed by a feedback delay buffer 14 that compensates for delay introduced by input buffer 13. The feedback signal may be selected by a control element 30 (for example, two memory cells) controlling a multiplexer 29 to create offset options for generating an output signal. If feedback is taken from signal 31, the output signal at terminal 12 will lag the input signal at terminal 11. If feedback is taken from signal 33, the signal at terminal 12 will lead the signal at terminal 11. If feedback is taken from signal 32, the input and output signals will be in phase.

Phase Detector 15

FIG. 2 shows a first embodiment of phase detector circuit 15 of FIG. 1. The buffered reference clock signal 17 is provided to a first phase detector input terminal X and routed to one input terminal of an XOR gate 134. A buffered feedback signal is provided to a second phase detector input terminal Y and routed to another input terminal of XOR gate 134. The output of XOR gate 134 controls pass transistor 135 such that when X is not equal to Y, a logical 1 error pulse turns on transistor 135. The two signals X and Y are also coupled to NAND gates 141 and 142. During simultaneous low values of the reference clock signal X and the feedback signal Y, gate 141 sets a latch 143 which turns on a second pass transistor 136. After latch 143 is set, a mismatch between X and Y results in both of transistors 135 and 136 being on. When both of transistors 135 and 136 are on, feedback signal Y charges or discharges capacitor 139 through resistor 138. Thus, when an out-of-phase condition exists following low signals, both of pass transistors 135, 136 conduct, and a driving signal integrated by capacitor 139 is provided on line 16 to voltage controlled delay elements 18, 19, 20 (FIG. 1). In this way, the phase detector circuit produces an error voltage that is proportional to the misalignment of the two input signals X and Y.

Initially, consider that signals X and Y are both logic 0. XOR gate 134 thus generates a low output signal and turns off transistor 135. The logic 0 signals cause latch 143 to output a logic 1 signal thus turning on transistor 136. When one of X or Y goes high, XOR gate 134 turns on transistor 135. There is no change in the high output signal from latch 143. Transistors 135 and 136 are thus both on. A high signal on Y increases the charge on capacitor 139. Thus, an increased charge on capacitor 139 increases the output voltage on line 16. This increased voltage increases the delay of voltage controlled delay elements 18, 19, and 20 of FIG. 1. A low signal on Y decreases the charge on capacitor 139, thus decreasing the delay of elements 18, 19, and 20. When both X and Y are high, NAND gate 142 generates a logic 0 output signal, which causes latch 143 to generate a low output signal, turning off transistor 136. Thus capacitor 139 remains at its adjusted voltage level. Capacitor 139 thereby integrates a signal indicative of the phase mismatch between the reference clock signal and the feedback signal. (In another embodiment, an increased voltage decreases delay of voltage controlled delay elements 18, 19, 20 and the decreased voltage from a low signal on Y increases the delay of elements 18, 19, 20. In yet another embodiment, the value of X rather than Y is integrated on capacitor 139. And in yet another embodiment, NAND gates 141 and 142 are interchanged so that integration occurs on the falling edge rather than the rising edge of Y.)

Buffer 140 is an analog device which provides an output error voltage 16 related to the voltage on capacitor 139. Error voltage 16 is then routed to the voltage-controlled delay circuit 50 (FIG. 1) including elements 18, 19, 20, which operate as discussed above (or in FIG. 4 to delay circuit 50 or 51).

FIG. 3 shows a second embodiment of phase detector 15 of FIG. 1. Those elements of FIG. 3 that are commonly shared with FIG. 2 have been given the same numeric designator. The embodiment of FIG. 3 incorporates two features not provided by the phase detector of FIG. 2: an optional inverter and a divider circuit. XOR gate 59 optionally inverts the feedback signal Y. Though FIG. 3 shows both divider circuit 57 and optionally inverting XOR gate 59, either of these elements can be provided alone in order to assure a rough phase adjustment in the direction of the acceptable delay range. Inverting the feedback signal in XOR gate 59 causes a voltage to be generated at 16 which moves X and Y to 180° out of phase.

The alternative phase detector circuit of FIG. 3 also includes a divide by N circuit 57 that produces a signal period adjusted to a multiple of the input period. In the exemplary embodiment of the invention, N is four, and combined with inversion of the output clock signal discussed above, results in a delay equal to two reference clock cycles. It should be appreciated that N may be chosen as appropriate for the available delay range, and that other values may be provided without departing from the spirit and scope of the invention.

The XOR gate and the divide by N circuit allow a rough adjustment of delay, for example when a circuit is initialized upon application of power, or after a loss of phase lock has occurred. Once rough phase lock is achieved or restored, an SR flip-flop 56 may be toggled to set the XOR gate 59 to cancel the input signal inversion, and to route the reference clock signal X around the divide by N circuit 57. Final phase lock adjustment is then made starting from the rough adjustment of delay. Switching of the SR flip-flop may be operator initiated, or it may be automatic based upon a start signal applied to the terminal 54, and a locked or lock detect signal applied to the terminal 55.

Figure 4:
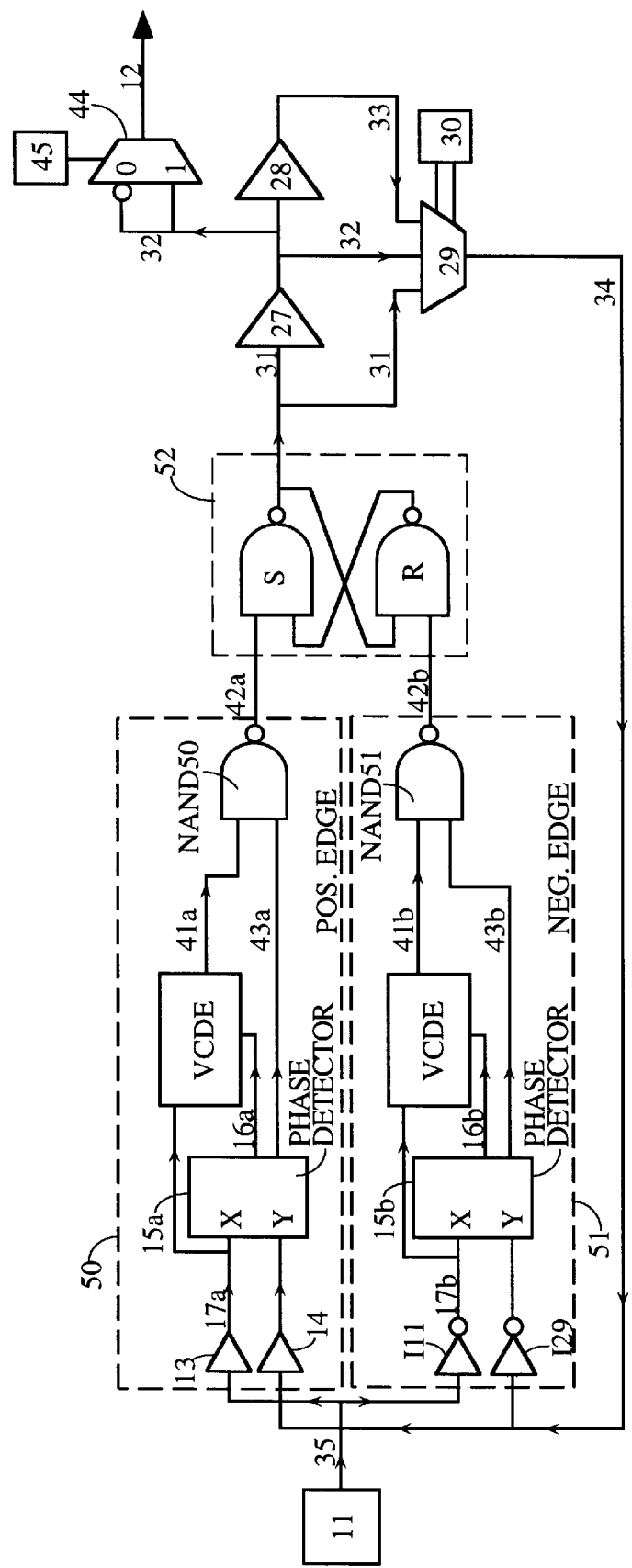
FIG. 4 illustrates a phase locked loop that generates an output clock signal synchronized at both rising and falling edges of the reference signal.

It is possible that the delay circuit described above (FIG. 1) may not produce an equal delay for both rising and falling transitions of the reference clock signal at input terminal 11. FIG. 4 is a schematic diagram of a circuit that generates a distributed output clock signal matched to the reference clock signal at both positive and negative edges. A positive edge phase detector circuit 50 causes the positive edge of the output signal at terminal 12 to have a selected phase relationship to the positive edge of the reference signal at terminal 11, and a negative edge phase detector circuit 51 causes the negative edge of the output signal at terminal 12 to have a selected phase relationship to the negative edge of the reference signal at terminal 11. The structure of circuits 50 and 51 of FIG. 4 may be the same as the structure of circuit 50 illustrated in FIG. 1. A latch 52 receives inverted output signals 42*a* and 42*b* generated by NAND gates NAND50 and NAND51 from the output signals 41*a* and 41*b* of delay circuits 50 and 51, respectively. Signals 43*a* and 43*b* are high only when X and Y are different following a period when X and Y are both low, as can be seen from looking at signal 43 in FIGS. 2 and 3. When delayed signal 41a is high and signal 43a is also high, inverted signal 42a goes low, causing set NAND gate S to output a logical 1 as signal 31. The output signal 31 is applied to an input terminal of reset NAND gate R. The signal on line 31 remains low until a positive edge of the delayed signal 41a causes signal 42a to go low. Then the signal on line 31 remains high until a positive edge of the signal at 41b in combination with a high signal at 43b causes the signal at 42b to go low. As was true in FIG. 1, feedback signal 34 causes phase detectors 15a and 15b in delay circuits 50 and 51 to bring signal 31, 32, or 33 into phase with signal 35 from input terminal 11.

Figure 5A:
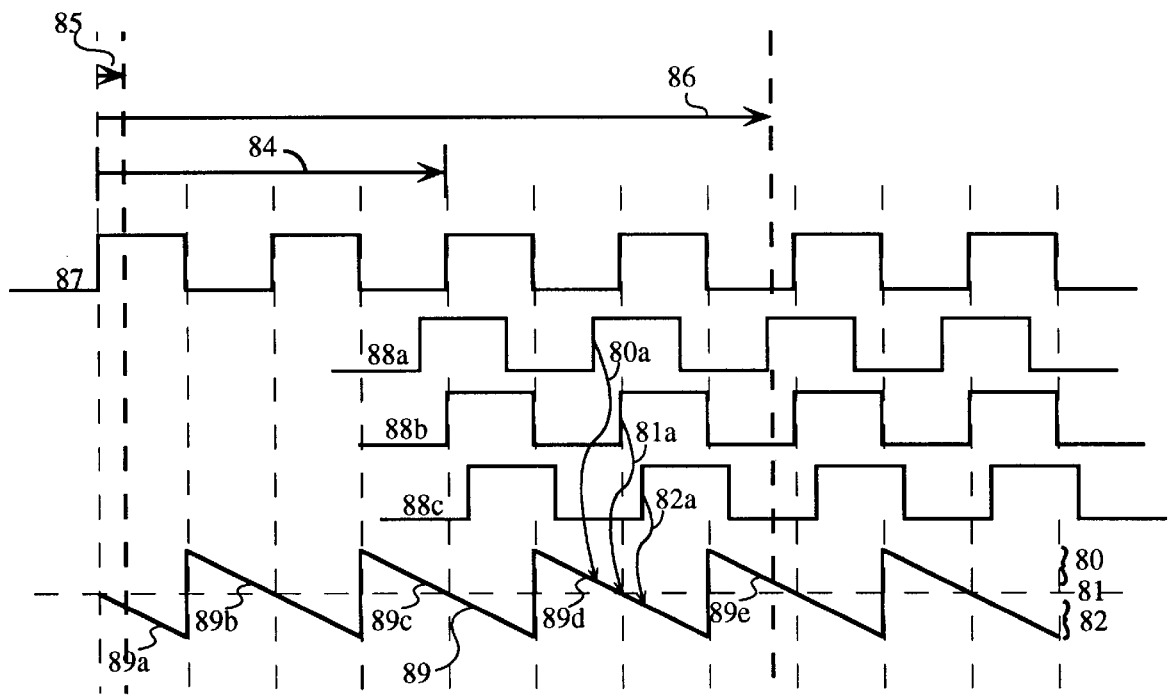
FIG. 5a is a timing diagram that plots phase v. error voltage during normal operation of the phase locked loop.

The lower curve in FIG. 5a plots phase (horizontal axis) vs error voltage (vertical axis) present on line 16 of FIGS. 1–4 showing phase between reference curve 87 and three different feedback curves 88a, 88b, 88c when the phase locked loop is operating in, its normal mode of operation. In the upper curves of FIG. 5a, an input reference clock signal 87 is plotted. Feedback signals 88a, 88b, and 88c are shown in the figure to be ahead of, in-phase with, and behind the input dock signal 87, but displaced by an integer number of cycles from the input signal, as indicated by line 84. The available range of delay between when a signal appears on line 17 and when the signal appears on line 17b is indicated by a minimum delay 85 and a maximum delay 86. Delay is a function of the number of delay elements 18, 19, and 20, which have been inserted into the delay path by control elements 24, 25, and 26 (FIG. 1). For any number of delay elements being used, the system has a minimum delay 85 determined by the sum of the minimum delays of those delay elements in the path. The system also has a maximum delay 86 determined by the sum of the maximum delays of the delay elements in the path. (Typically, a user will program the circuit using control elements 24, 25, 26 to place more delay elements 18, 19, 20 into the path when the clock frequency is low, say 10 MHz, and fewer delay elements 18, 19, 20 into the path when the clock frequency is high, say 100 MHz.)

A sawtooth curve 89 having a series of diagonal lines indicates the phase variations of feedback clock signals such as signals 88a, 88b, and 88c for which the phase detector produces a signal that indicates it is necessary to increase the amount of delay (80), that there is no error detected (81), or that it is necessary to decrease the amount of delay (82). Arrows 80a, 81a, and 82a show points on curve 89 generated by the phase relationships 88a, 88b, and 88c respectively. In FIG. 5a, three cycles 89b, 89c, 89d of curve 89 exist between the minimum delay 85 and the maximum delay 86 which can be generated by voltage controlled delay elements 18, 19, 20. If the delay generated by delay elements 18, 19, 20 falls anywhere along one of these complete cycles the output signal indicating whether delay should be increased or decreased will cause delay to be adjusted in the proper direction.

If the circuit is operating in region 89a at or near the minimum delay portion of the operating range, the resulting correction voltage attempts to produce a delay that is out of the available delay range. Because the minimum delay which the delay elements 18, 19, 20 can produce is at line 85, no additional reduction in delay is possible and the circuit could not therefore adjust to provide a correct amount of delay. A similar situation exists in region 89e. For this reason, the phase detector shown in FIG. 3 provides a rough initialization adjustment to bring the error voltage within the middle of the available delay range, between the maximum and minimum extremes.

Figure 5B:
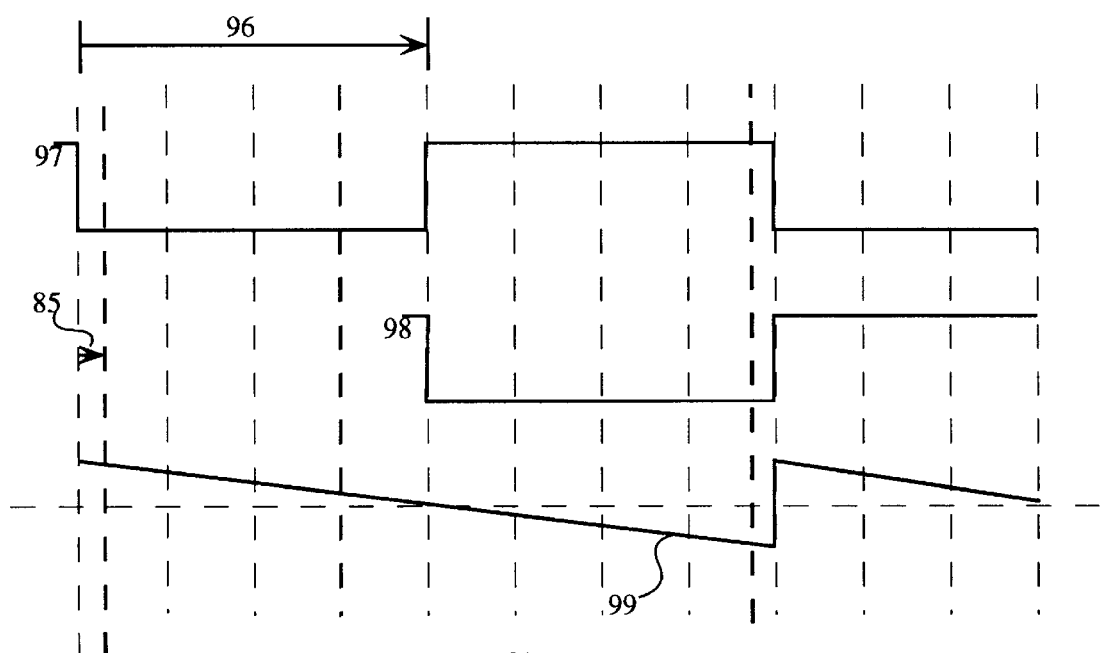
FIG. 5b is a timing diagram that plots phase v. error voltage during rough adjustment of the phase locked loop.

FIG. 5b is a timing diagram that plots v. error voltage 99 according to the embodiment shown in FIG. 3 when operating in its rough adjustment mode. In FIG. 5a, signals 87 and 88 are in phase. In FIG. 5b, signals 97 and 98 are out of phase. Signal 97 of FIG. 5b has one fourth the frequency of reference signal 87 of FIG. 5a. Time unit 96 in FIG. 5b is the same as time unit 84 of FIG. 5a. In FIG. 5b, inversion of the output signal causes the error voltage to adjust the delay to be the duration of the low level of the reference clock signal 97. This is an integer number of cycles of reference clock signal 87. The value of N in the divide by N circuit can be chosen so that the delay falls between minimum delay 85 and maximum delay 86. Once the delay is adjusted using inversion and the longer cycle time, the rough adjustment mode with inversion can be discontinued, and the division circuit 57 bypassed. Thus, the rough adjustment circuit is switched out of the delay path, and a more precise delay adjustment is then made. The circuit continues operating as in FIG. 5a with a delay in the acceptable range.

Figure 6:
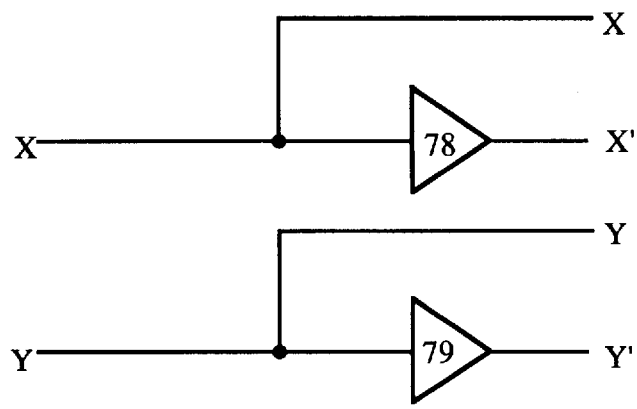
FIG. 6 is a schematic diagram of a delay circuit for use with a lock/unlock detector usable with the invention.
Figure 7:
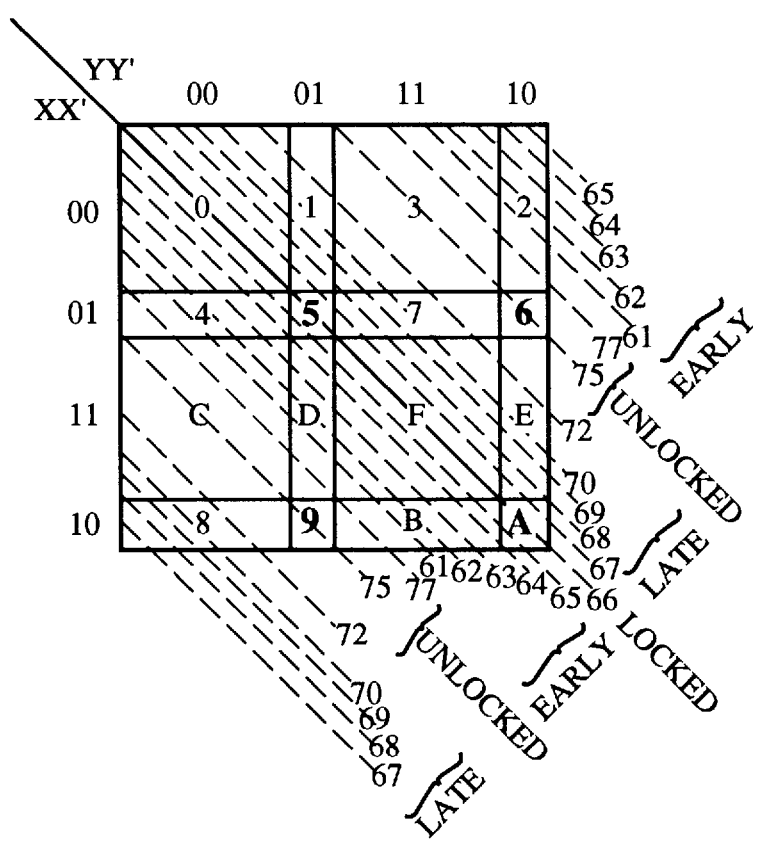
FIG. 7 is a Karnaugh map showing the 16 phase-locked loop states of operation in accordance with one embodiment of the invention.
Figure 8A:
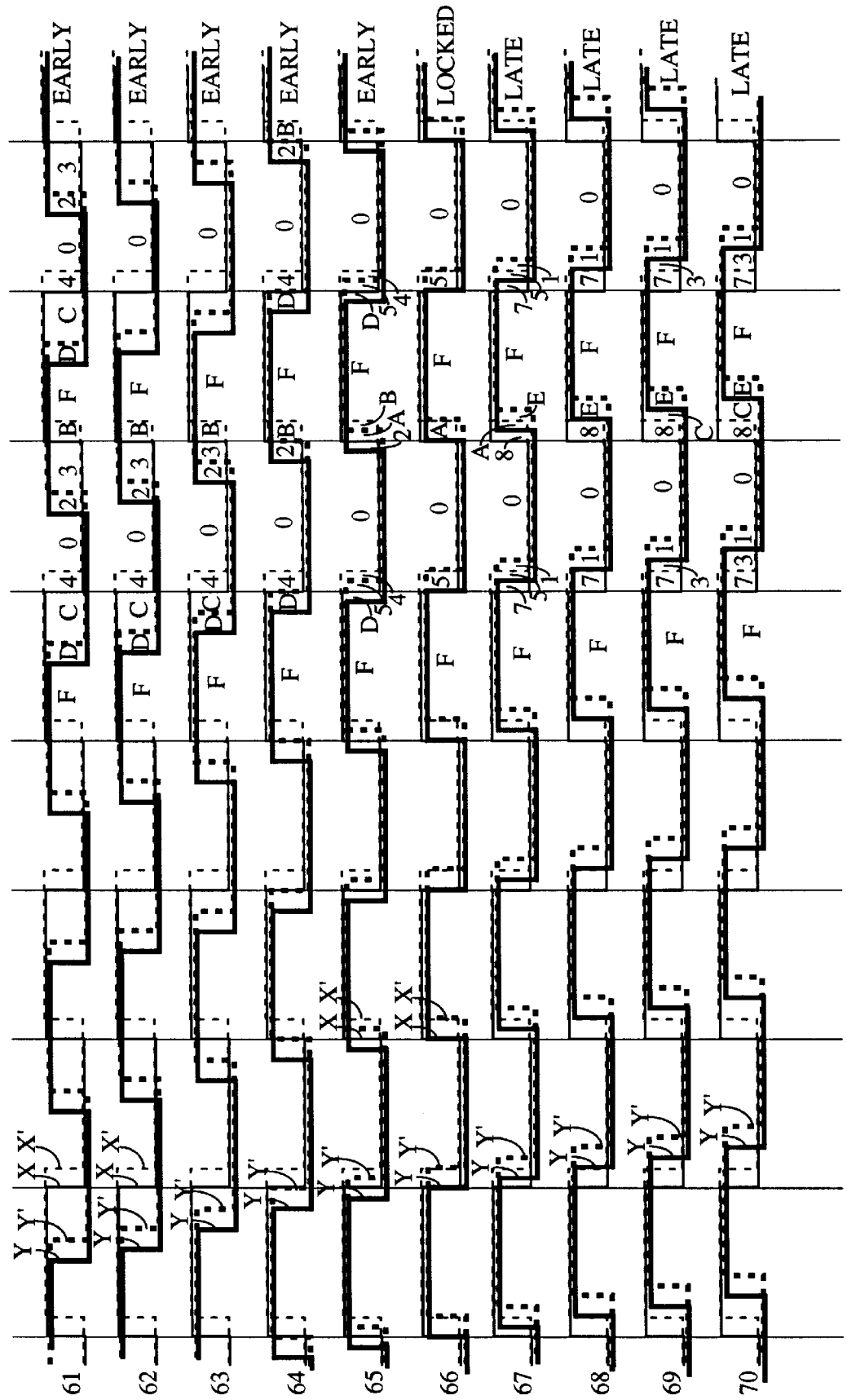
FIG. 8 (comprising FIGS. 8A and 8B) is a timing diagram showing wave forms and states corresponding to the states of FIG. 7.
Figure 8B:
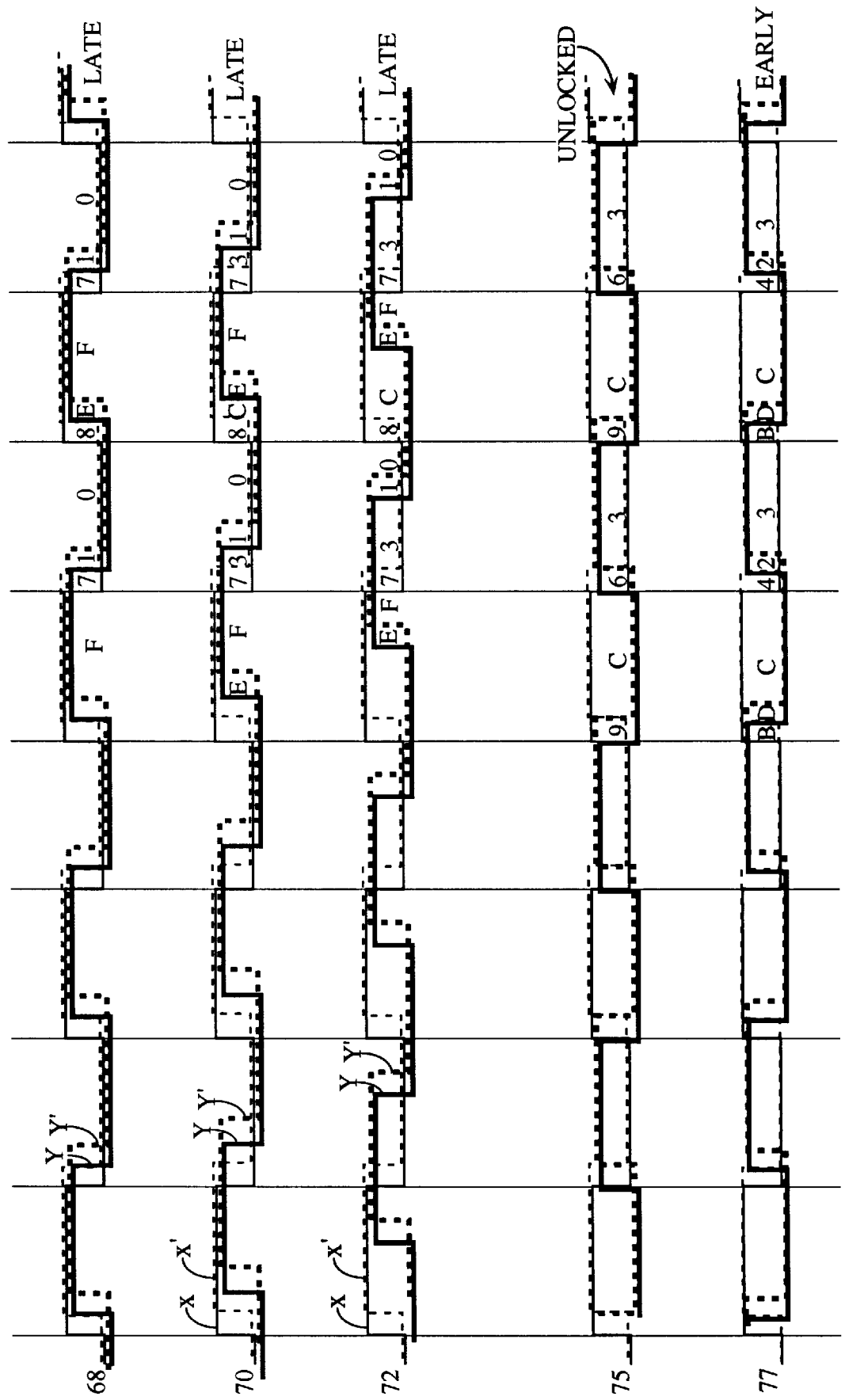

One aspect of the invention assures that both rough and fine phase adjustments will produce a phase-lock within an allowable delay range. FIGS. 6, 9 and 10 show structures which can achieve the adjustment. FIGS. 7 and 8 (comprising FIGS. 8A and 8B) show diagrams which assist the reader with understanding how the structure achieves its purpose. In FIG. 6 input signal X and feedback signal Y to phase detector 15 are also provided to delay elements 78 and 79 respectively. Thus four signals: X, X', Y, and Y' are generated. X' and Y' are delayed versions of X and Y, respectively. FIG. 8 shows several curves in which different phase relationships between the reference input signal at X and the feedback signal at Y are illustrated. In FIG. 8, the input wave form X is shown as a solid line, while the slightly delayed version of the signal X' is shown as a dashed line. The figure also shows feedback wave form Y, along with similarly delayed version Y'. Wave form Y is shown as a heavy solid line, and delayed wave form Y' is shown as a heavy dashed line.

All of the curves in FIG. 8 show the same relationship between X and X' and the same relationship between Y and Y' because the delays for those signals are constant, as can be understood from FIG. 6. However, curves 61 through 72 show different phase relationships between the X signal and the Y signal, illustrating different degrees of being out of a properly locked state. Curve 61 illustrates a state in which the Y feedback signal is early with respect to the X reference signal. Curve 66 illustrates the locked state in which X and Y are exactly in phase with each other. Curve 70 illustrates a state in which feedback signal Y is late with respect to input signal X. Curve 75 illustrates a state in which the feedback signal Y is completely out of phase with input signal X, producing a completely unlocked condition.

FIG. 7 shows a Karnaugh map of the 16 states which can occur through different combinations of the four signals X, X', Y and Y'. State 0 represents the condition in which X, X', Y, and Y' are all logical 0. State 1 represents the condition in which X, X', and Y are logical 0 but the delayed signal Y' is logical 1. The other states can be discerned from reviewing FIG. 7. Also shown in FIG. 7 are diagonal lines which correspond to the curves illustrated in FIGS. 8a and 8b. Curve 61, for example, at the top of FIG. 8a is represented in FIG. 7 by two diagonal lines extending through two parts of the Karnaugh map. Curve 61 illustrates an early unlocked state in which feedback signal Y arrives at the detector before the next reference signal X arrives at the detector. Both FIG. 7 and FIG. 8 illustrate that the signals represented by curve 61 occupy eight of the sixteen states. As illustrated most clearly in FIG. 8, the states move in a sequence from state F to state D to state C to state 4 to state 0 to state 2 to state 3 to state B and back to state F where the states repeat in that order again. For example in FIG. 7, curve 61, when viewed extending from the lower right to the upper left moves through states B, F, D, C, 4, 0, 2 and 3. Note particularly for curve 66, in which signal X is locked with signal Y, that in FIG. 7 the only states occupied are states A, F, 5 and 0. Likewise in FIG. 8, curve 66 occupies only states F, 5, 0 and A. Curve 75, the fully out-of-phase curve, occupies only states 9, C, 6, and 3. Other illustrated wave forms in FIG. 8 are also illustrated in FIG. 7 and show various phase relationships between input signal X and feedback signal Y.

FIG. 9 shows two circuits which can be used for determining locked and unlocked conditions. The particular circuits in FIG. 9 detect states A and 5 for a locked condition and states 9 and 6 for an unlocked condition. In FIG. 9 the locked output signal 73 derived from detecting states from A and 5 can be used for generating the signal on line 55 in FIG. 3 to set/reset circuit 56. Unlocked signal 77 derived from detecting unlocked states 9 and 6 can be used in FIG. 3 for generating a set signal on line 54 to set/reset circuit 56. With this arrangement, the unlocked state represented by either states 9 or 6 will cause the structure of FIG. 3 to move into its rough phase-lock mode in which an approximate lock is determined. Using this combination of circuits, the rough adjustment provided when set/reset circuit 56 is generating a high signal will not bring the phase locked loop of FIG. 1 or FIG. 4 into perfect lock. However, when the two signals have moved into partial alignment, states 9 and 6 are no longer detected, and states A and 5 start being detected. A high LOCKED signal on line 73 can be used in FIG. 3 to generate a reset signal on line 55 to reset circuit 56, which places the circuit of FIG. 3 into its normal adjustment mode of operation so that the phase locked loop can be brought into full lock.

FIG. 10 shows another circuit for detecting locked and unlocked conditions which may be used to respond to an out-of-lock condition. Sometimes a phase locked loop may generate a feedback signal which is repeatedly either early or late with respect to an input signal. In FIG. 10, early and late states C and 3 are detected. The counters count when state A does not exist and therefore signals X and Y are at least partly out of phase. Early and late upcounters EARLY and LATE count repeated occurrences of the same state. Late counter LATE counts high signals on line 93 coinciding with a falling edge of feedback signal Y, which indicates the number of cycles for which both Y and Y' were high while X and X' were low. Likewise, early counter EARLY counts high signals on line 92 coinciding with the falling edge of input signal X, indicating the number of cycles for which both X and X' were high while Y and Y' were low. The counters are reset when state A (X high, X' low, Y high, and Y' low) exists, indicating lock. If either counter limit is reached, a high output signal is generated and causes OR gate 90 to generate a high FLAG signal on line 91.

The flag signal on line 91 may be used to send a signal to change the delay range in voltage controlled delay elements 18, 19, 20 of FIG. 1 or VCDE of FIG. 4, to make a particular delay either greater or less than was programmed, or to move phase detector 15 to a rough adjustment mode.

Although the invention is described herein with reference to the preferred embodiments, one skilled in the art will readily appreciate that other applications may be substituted for those set forth herein without departing from the spirit and scope of the present invention. Accordingly, the invention should only be limited by the claims included below.

I claim:

1. A phase-locked loop, comprising:

a positive phase detector including a first terminal connected to receive a reference input clock signal, and a second terminal connected to receive an output clock feedback signal, said positive phase detector producing a positive phase detector output signal indicative of a phase difference between a positive edge of said reference input clock signal and a positive edge of said output clock feedback signal;

at least one voltage controlled delay element connected to receive said positive phase detector output signal, said voltage controlled delay element producing a positive output clock signal with a positive edge that is delayed from said positive edge of said reference input clock signal by an amount related to said positive phase detector output signal;

a negative phase detector including a first terminal connected to receive said reference input clock signal, and a second terminal connected to receive said output clock feedback signal, said negative phase detector producing a negative phase detector output signal indicative of a phase difference between a negative edge of said reference input clock signal and a negative edge of said output clock feedback signal;

at least one voltage controlled delay element connected to receive said negative phase detector output signal, said voltage controlled delay element producing a negative output clock signal with a negative edge that is delayed from said negative edge of said reference input clock signal by an amount related to said negative phase detector output signal; and an output clock signal generator for generating an output clock signal having a positive clock edge in phase with said positive edge of said positive output clock signal and a negative clock edge in phase with said negative edge of said negative output clock signal, said output clock feedback signal being derived from said output clock signal.

2. A phase-locked loop, comprising:

a phase detector including a first terminal connected to receive a reference input clock signal, and a second terminal connected to receive an output clock feedback signal, said phase detector producing a phase detector output signal indicative of a phase difference between said reference input clock signal and said output clock feedback signal;

at least one voltage controlled delay element connected to receive said phase detector output signal, said voltage controlled delay element producing an output clock signal that is in a selected phase relationship with said reference input clock signal, and that is delayed relative to said reference input clock signal; and counting means for detecting repeated phase errors in the same direction and for generating a flag when a number of repeated phase errors in the same direction exceeds a limit;

wherein said output clock feedback signal received at said second terminal of said phase detector is derived from said output clock signal generated by said at least one voltage controlled delay element.

* * * * *